United States Patent [19]

Wong

[11] Patent Number: 4,552,818

[45] Date of Patent: Nov. 12, 1985

[54] SILICONE ENCAPSULANT CONTAINING PORPHYRIN

[75] Inventor: Ching-Ping Wong, Lawrence Township, Mercer County, N.J.

[73] Assignee: AT&T Technologies, Inc., Berkeley Heights, N.J.

[21] Appl. No.: 608,836

[22] Filed: May 10, 1984

[51] Int. Cl.⁴ .................................................. B32B 9/04
[52] U.S. Cl. ................................ 428/447; 174/110 S; 174/110 SR; 524/89; 524/91; 524/94; 524/98
[58] Field of Search .................. 524/89, 91, 94, 98; 174/110 S, 110 SR; 428/447

[56] References Cited

U.S. PATENT DOCUMENTS

| | | | |
|---|---|---|---|
| 2,950,237 | 8/1960 | Sharp | 204/158 |
| 2,951,798 | 9/1960 | Sharp | 204/162 |
| 2,951,799 | 9/1960 | Sharp | 204/162 |
| 3,687,863 | 8/1972 | Wacher | 252/300 |
| 3,931,026 | 1/1976 | Berkner | 524/423 |
| 4,330,637 | 5/1982 | Wong | 524/720 |

OTHER PUBLICATIONS

Adler, Alan D., "Solid State Possibilities of Porphyrin Structures", *Conference Proceedings of the International Conference on Organic Superconductors*, Honolulu, Hawaii, USA (Sep. 5-9, 1969), pp. 73-78.

*Primary Examiner*—Melvyn I. Marquis
*Attorney, Agent, or Firm*—J. F. Spivak

[57] ABSTRACT

An encapsulant for an electronic device comprises a silicone resin having a highly colored porphyrin compound doped therein.

6 Claims, 2 Drawing Figures

SILICONE ENCAPSULANT CONTAINING PORPHYRIN

TECHNICAL FIELD

This invention relates to electronic devices such as semiconductor devices and integrated circuits having silicone encapsulants and more particularly, to electronic devices wherein the silicone encapsulant includes a porphyrin compound so as to make the encapsulant readily visible to the naked eye.

BACKGROUND OF THE INVENTION

Electronic devices, particularly integrated circuits and semiconductors are often coated or encapsulated with a polymeric silicone resin, such as a room temperature vulcanized (RTV) or heat cured silicone elastomers, to protect the device from mechanical damage and from adverse environmental effects of temperature and humidity.

The silicone elastomer encapsulants which are generally employed, are used in very small quantities on the device and are transparent in color so that they are not readily visible by the naked eye. This transparency, especially when employed in relatively thin coatings, makes the encapsulant difficult to see for inspection purposes with the naked eye. Since quality control techniques which are generally employed in the production of encapsulated devices often require visual inspection of the devices to insure that the encapsulant has been placed over the device and is adherent thereto, it would be highly beneficial to modify the silicone elastomer so that it became highly colored and readily visible to the naked eye. However, any additive which is employed with the elastomer should preferably be employed in very small quantities requiring it to have a high molar extinction coefficient in the visible range and should in no way adversely effect the electrical or mechanical properties of the silicone elastomer and of course should be soluble in the elastomer at least in the quantity required to impart sufficient coloration. Such a colorant has now been found.

SUMMARY OF THE INVENTION

In accordance with the present invention, an article of manufacture comprises an electronic device and an encapsulant thereover, the encapsulant being a polymeric silicone resin containing less than 0.1 weight percent of a soluble colored porphyrin compound.

DETAILED DESCRIPTION

Figure 1:
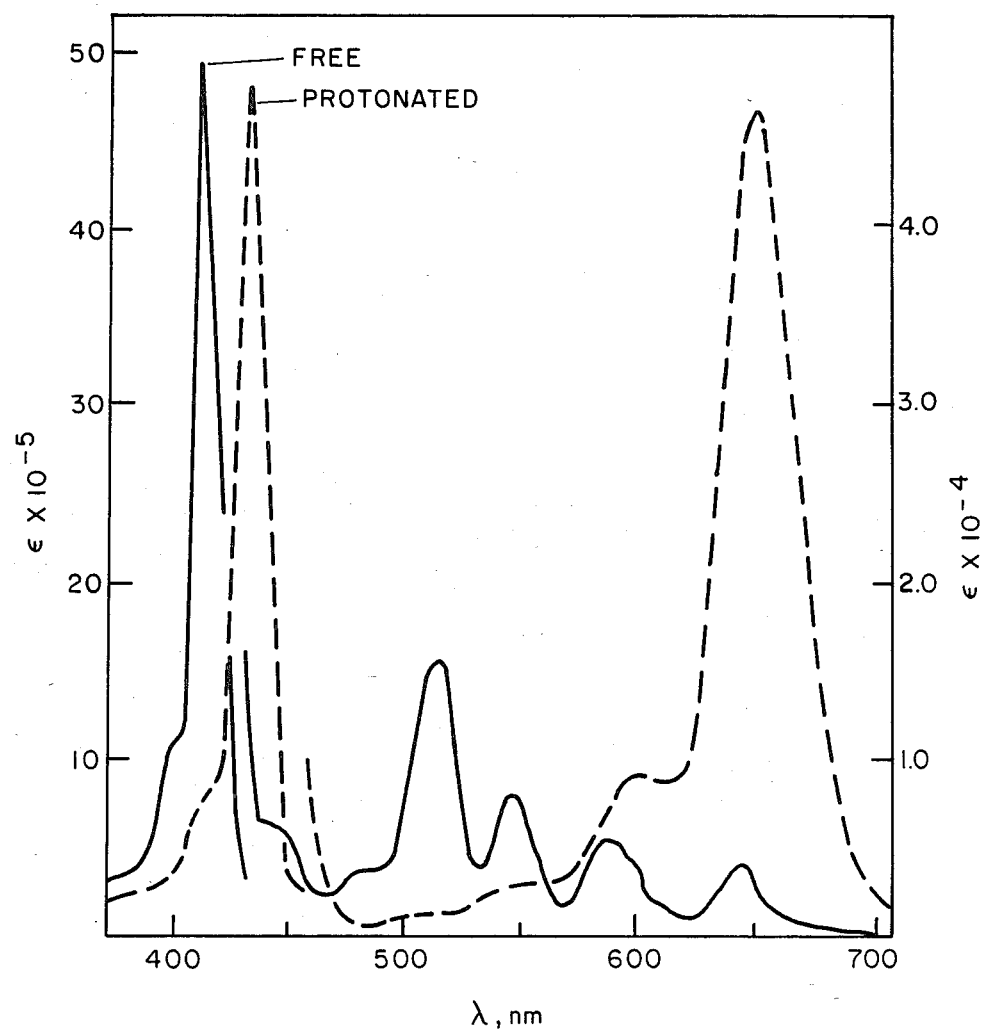
FIG. 1 is the absorption spectra of tetraphenylporphyrin in the visible range.

Electronic devices are often covered with a polymer elastomer to protect the device from adverse environmental factors. In order to be a candidate as an encapsulant, the polymer should have good adhesion to the underlying device which it is to encapsulate and should protect the device from moisture even at high temperature and humidity conditions. Further, the encapsulant should be a good electrical insulator and have good mechanical properties as well as being stable over long periods of time. Polymeric silicone resins have generally been shown to meet these requirements. However, these resins are colorless and are difficult to see with the naked eye especially when only small amounts of encapsulant material are employed over the electronic device. This property of silicone resins makes visual inspections during quality control somewhat difficult. It has now been discovered that by adding small quantities, e.g., 0.02 to 0.1 weight percent of a free porphyrin to the silicone encapsulant a visible color is imparted to the encapsulant without any detrimental effects on the electrical or physical properties of the encapsulant.

Any free porphyrin having a molar extinction coefficient of at least $1 \times 10^4$ liters mole$^{-1}$ cm$^{-1}$ in the visible spectrum and which is soluble in the silicone resin at least in the small quantities employed in accordance with this invention is suitable. The molar extinction coefficient of a material at a given wavelength is a measure of the absorption of light at that wavelength. It arises from Beers' Law which may be represented by the formula $I = I_o 10^{-ECX}$ where $I_o$ is the intensity of incident light, I is the intensity of the light exiting the material, C is the concentration in moles/liter, X is the thickness in cm of the material through which the light travels and E is the extinction coefficient. A preferred porphyrin is tetraphenylporphyrin. This compound exhibits a readily visible pink color even in very low concentrations in the silicone resin and has a peak molar extinction coefficient at about 410 nm of about $5 \times 10^6$.

Generally, suitable porphyrins have the structural formula:

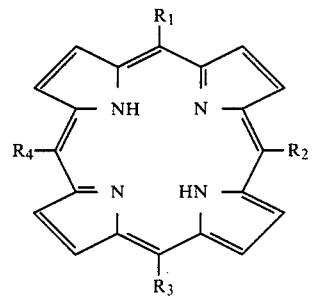

wherein $R_1$, $R_2$, $R_3$ or $R_4$ is a 1 to 7 carbon alkyl, a phenyl, a p-methyl phenyl, a fluorophenyl, and any derivative thereof.

An added benefit in the use of porphyrin is that the porphyrin compounds generally exhibit a color change in the presence of an acid. Consequently, the porphyrin can be used not only for the purpose of imparting a color but also for detecting whether the encapsulant has any traces of free hydrogen ion such as from hydrogen chloride contamination. For example, meso-tetraphenylporphyrin which is generally pink in color changes to a green color in the presence of trace amounts of HCl.

Essentially any silicone resin which is suitable for use as an encapsulant is suitable for use with the free porphyrins as taught herein. Silicones useful as encapsulants are well known in the art. In order to facilitate solution of the porphyrin in the silicone, one may first dissolve the porphyrin in xylene and add the xylene solution to the silicone resin.

Referring to FIG. 1, there is shown the molar extinction coefficients of free meso-tetraphenylporphyrin and protonated tetraphenylporphyrin in trichloromethane at room temperature. It can be seen that these porphyrin compounds exhibit extremely high molar extinction coefficients (especially in the region of 400 to 450 nm where the coefficients are two orders of magnitude greater than the remainder of the spectrum, i.e., $10^6$ vs. $10^4$), thereby making only small amounts of the tetraphenylporphyrin necessary in the silicone resin in order to impart a color to the resin. Further, one can see the sharp change in absorption between the free tetraphenylporphyrin and the protonated material.

Figure 2:
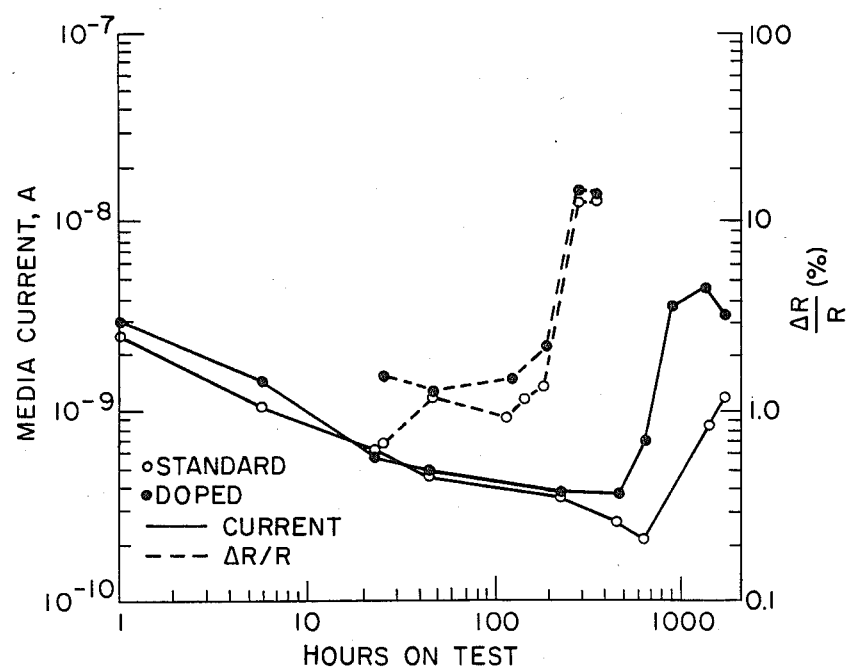
FIG. 2 is a plot of leakage current of test devices coated with porphyrin-doped silicone resin and undoped silicone resin.

FIG. 2 is a graphical representation of the results of an aging test performed at 85° C. and 85 percent humidity under a DC bias of 180 volts. The test results indicate the average current as well as the percent change of resistance of a standard clear Dow Corning silicone resin encapsulant as compared with the same encapsulant doped with 0.025 weight percent of free tetraphenylporphyrin as a function of time. These tests were done in what is called a triple track test device which device and operation is more fully described in my U.S. Pat. No. 4,330,637 which is incorporated herein by reference. As can be seen from the measurements, there is only little difference between the test results for the standard commercially available silicone resin and the tetraphenyl porphyrin-doped material.

It should be noted that many other die materials were tried in conjunction with the silicone resins to impart a color thereto. For example, fluorescein dyes, alizarin dyes, quinizarin, phthalocyanine, methylene violet, methylene blue, methyl red, ethyl blue, cresol dyes, and 9,10-diphenylanthracene were doped into silicone resin, however, the resultant encapsulant did not meet the electrical requirements, and/or insufficient color was imparted to the encapsulant.

It is to be understood that the above-described embodiments are simply illustrative of the principles of the invention. Various other modifications and changes may be devised by those skilled in the art which will embody the principles of the invention and fall within the spirit and scope thereof.

What is claimed is:

1. An article of manufacture comprises an electronic device and an encapsulant thereover, said encapsulant being a polymeric silicone resin containing from 0.02 to 0.1 weight percent of a soluble colored, free porphyrin compound having a molar extinction coefficient to a wavelength in the visible spectrum of at least $1 \times 10^4$ liter mole$^{-1}$ cm.$^{-1}$.

2. The article recited in claim 1, wherein the porphyrin is a tetraphenylporphyrin.

3. The article recited in claim 1, wherein the porphyrin is represented by the structural formula:

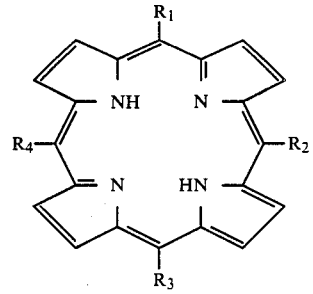

and wherein $R_1$, $R_2$, $R_3$ and $R_4$ are 1 to 7 carbon radicals selected from the group consisting of alkyl, phenyl and substituted phenyl radicals.

4. A composition of matter comprising a polymeric silicone resin containing from 0.02 to 0.1 weight percent of a soluble colored, free porphyrin compound having a molar extinction coefficient to a wavelength in the visible spectrum of at least $1 \times 10^4$ liter mole$^{-1}$ cm.$^{-1}$.

5. The composition recited in claim 4, wherein the porphyrin is a tetraphenylporphyrin.

6. The composition recited in claim 4, wherein the porphyrin is represented by the structural formula:

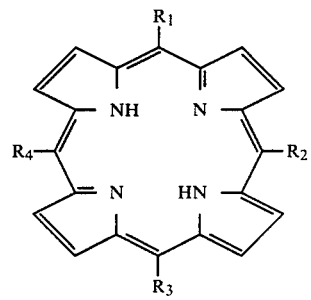

and wherein $R_1$, $R_2$, $R_3$ and $R_4$ are 1 to 7 carbon radicals selected from the group consisting of alkyl, phenyl and substituted phenyl radicals.

* * * * *